United States Patent
Fujiwara et al.

(10) Patent No.: US 8,401,136 B2
(45) Date of Patent: Mar. 19, 2013

(54) SEMICONDUCTOR INTEGRATED CIRCUIT AND COMMUNICATION SYSTEM

(75) Inventors: Yoshiaki Fujiwara, Osaka (JP); Toshio Takita, Osaka (JP)

(73) Assignee: Panasonic Corporation, Osaka (JP)

( * ) Notice: Subject to any disclaimer, the term of this patent is extended or adjusted under 35 U.S.C. 154(b) by 808 days.

(21) Appl. No.: 12/570,206

(22) Filed: Sep. 30, 2009

(65) Prior Publication Data
US 2010/0086089 A1    Apr. 8, 2010

(30) Foreign Application Priority Data
Sep. 30, 2008    (JP) .................. 2008-254326

(51) Int. Cl.
*H04L 7/00* (2006.01)
(52) U.S. Cl. .......... 375/354; 375/260; 375/253; 360/70; 360/73.02; 360/73.03
(58) Field of Classification Search .............. 375/354
See application file for complete search history.

(56) References Cited

U.S. PATENT DOCUMENTS

| 4,918,544 A * | 4/1990 | Ishizuka et al. ............ 360/73.03 |
| 6,392,455 B1 | 5/2002 | Yarborough, Jr. |
| 2004/0000939 A1 | 1/2004 | Meguro |
| 2008/0115005 A1 | 5/2008 | Kamada |

* cited by examiner

*Primary Examiner* — Lihong Yu
(74) *Attorney, Agent, or Firm* — McDermott Will & Emery LLP

(57) ABSTRACT

Disclosed is a semiconductor integrated circuit for generating a frequency division clock signal that approximates a desired clock signal without increasing a size thereof. The semiconductor integrated circuit masks, for each programmable cycle, a clock signal to be supplied to a transmission clock generation unit 100, thereby delaying a counting operation of a clock counter 101, and setting a timing for extending a transmission clock signal so as to cause a transmission rate of an average frequency of the transmission clock signal to approximate a predetermined transmission rate, wherein the transmission clock generation unit 100 divides a frequency of a clock source signal S301 that is a high-speed clock signal.

14 Claims, 9 Drawing Sheets

SEMICONDUCTOR INTEGRATED CIRCUIT AND COMMUNICATION SYSTEM

BACKGROUND OF THE INVENTION

1. Field of the Invention

The present invention relates to a semiconductor integrated circuit, and in particular to the frequency division of a clock pulse signal.

2. Description of Related Art

Conventionally, clock pulse signals required for circuits need to be supplied in accordance with the respective circuits. However, providing a plurality of clock oscillators for generating such clock pulse signals increases the circuit size. One method for avoiding an increase in the circuit size is to generate the clock pulse signals by dividing the frequency of a high-speed clock pulse signal generated from one clock oscillator. Here, dividing the frequency of a clock pulse signal refers to a repetitive operation of counting pulses of the clock pulse signal with use of a frequency division counter, causing an output signal to rise or fall when the counter value reaches a predetermined setting value, and then resetting the counter value to zero. For example, with the setting value of six, a clock pulse signal is generated by dividing by six the frequency of a high-speed clock pulse signal, provided that rising edges and falling edges are both to be counted. In other words, the generated clock pulse signal remains High (hereinafter, "Hi") for three clocks and Low for another three clocks.

However, the above-described method only enables an integral frequency division of a high-speed clock pulse signal, and not a fractional frequency division of the high-speed clock pulse signal.

To realize the fractional frequency division, Patent Document 1 (Japanese National Publication of the Translated Version of PCT Application No. 2004-519958) discloses a technique for generating a pulse signal whose cycle approximates a desired cycle by switching the number of frequency division between N and N+1. Here, the number of frequency division refers to a setting value by which the frequency of a clock pulse signal is divided, and is set in a frequency division counter that counts the pulses of the clock pulse signal.

Meanwhile, in one conventional attempt to reduce the circuit size of a frequency division counter and a comparison circuit, a prescaler is used to divide the frequency of a high-speed clock signal to generate a clock source signal for the frequency division counter. However, the use of the prescaler is not practically applicable to the conventional frequency division as shown in the aforementioned Patent Document 1, namely a method for causing an average frequency of two generated clock signals to approximate a frequency having a predetermined cycle. Specifically, if the prescaler is used in the method of the Patent Document 1, the cycle of a clock signal generated based on the cycle of a clock signal output from the prescaler varies. Therefore, although the cycle of the clock signal is supposed to approximate an ideal cycle, a phase difference between the generated clock signal and the ideal clock signal becomes large, resulting in the circuit not operating normally.

Assume here that the circuit is a communication circuit, that a clock signal having a frequency divided by 6.5 is necessary, and that the prescaler obtains the clock source signal for the frequency division counter by dividing a high-speed clock signal by two. In this case, if a method as shown in the Patent Document 1 is used, a 6.5-frequency-division clock signal is generated with use of one 8-frequency-division clock signal and three 6-frequency-division clock signals ((8+6+6+6)/4=6.5). However, since a phase difference between the 8-frequency-division clock signal and the ideal 6.5-frequency-division clock signal is substantially equivalent to 1.5 cycles of the high-speed clock signal, the circuit sometimes fails to operate normally.

SUMMARY OF THE INVENTION

In view of the above-described problem, the present invention provides a semiconductor integrated circuit that generates a clock signal by dividing the frequency of a high-speed clock signal in a manner that minimizes a phase difference between the generated clock signal and an ideal clock signal.

Means to Solve the Problem

In order to solve the present invention provides a semiconductor integrated circuit comprising: a clock control unit operable to output a gated clock signal generated by masking an input clock signal for a predetermined period starting from each predetermined timing; and a signal output unit operable to output one pulse of an output clock signal each time a number of pulses of the gated clock signal reaches a predetermined count.

Effect of the Invention

Conventionally, the Signal output unit receives the input clock signal without modification. However, with the stated structure, the signal output unit receives the gated clock signal generated by masking the input clock signal. This substantially delays the counting operation where the signal output unit counts the pulses of the gated clock signal. Also, the number by which the input clock signal is to be divided can be changed by masking the input clock signal for a predetermined period starting from each predetermined timing. This makes it possible to output the output clock signal whose average frequency approximates an ideal clock signal.

Also, the semiconductor integrated circuit may further comprise: three registers that each hold therein values A, B, and C respectively, wherein the values A, B, and C are each a natural number, and B>C, and the clock control unit may determine each of the predetermined timings based on the value B and the value C, the predetermined count may be equal to the value A and the semiconductor integrated circuit may divide a frequency of the input clock signal by A+C/B.

Also, the clock control unit may include: a selector operable to select and output one of (i) the value C and (ii) a subtraction value obtained by subtracting the value B from the value C; an addition result holding buffer that holds therein an addition value, and that is operable to output the addition value at a rising edge of the output clock signal; an addition circuit operable to overwrite the addition value held by the addition result holding buffer, with a new addition value obtained by adding the value output from the selector to the addition value output from the addition result holding buffer; a judgment subunit operable to judge, when the addition result holding buffer outputs the addition value, whether the addition value is greater than a reference value X; and a gated clock output subunit operable to output the gated clock signal generated by masking one clock of the input clock signal, when the addition value is judged to be greater than the reference value X, the selector may select and output the subtraction value when the addition value is judged to be greater than the reference value X, and select and output the value C when the addition value is judged to be equal to or less than the reference value X, each of the predetermined timings may be at a rising edge of the output clock signal and when the addition value held by the addition result holding buffer is greater than the reference value X, an initial value Y of the addition result holding buffer may satisfy X−(B−C)<Y≦X+C, the signal output unit may include: a gated clock counter operable to count the pulses of the gated clock signal supplied from the clock control unit; a division number setting register that is one of the three registers and holds therein the value A as a setting value by which the gated clock signal is to be divided; and an output subunit operable to output the output clock signal by inverting a value of the output clock signal when a count value of the gated clock counter matches a value that is half the setting value set in the division number setting register.

With the stated structure, in the case of realizing the frequency division of A+C/B, the timings for masking the input clock signal are almost equally arranged in a predetermined cycle. This makes it possible to output the output clock signal whose average frequency approximates the ideal clock signal.

Also, the clock control unit may further include: a first setting register that is one of the three registers and holds therein the value C as a first setting value; a second setting register that is one of the three registers and holds therein the value B as a second setting value; and a subtraction circuit operable to subtract the second setting value from the first setting value, and the selector may select and output one of the first setting value and the subtraction value.

With the stated structure, an ideal frequency division of A+C/B is easily realized by simply setting the value C in the first setting register, the value B in the second setting register, and the value A in the division number setting register.

Also, the gated clock output subunit may be further operable to mask one clock of the input clock signal at a falling edge of the output clock signal.

In this way, the present invention is applicable to a case where the value A set in the division number setting register is an odd number.

Also, the present invention may be a communication system for generating an output clock signal for a communication circuit by dividing a frequency of an input clock signal, the communication system comprising: the communication circuit; the above-described semiconductor integrated circuit; a clock oscillator operable to supply the input clock signal to the semiconductor integrated circuit, wherein the semiconductor integrated circuit may receive the supply of the input clock signal, divide the frequency of the input clock signal to generate the output clock signal such that a cycle of the input clock signal approximates a cycle of a necessary clock signal for the communication circuit, and supply the output clock signal to the communication circuit, and the communication circuit may perform communication based on the output clock signal supplied by the semiconductor integrated circuit.

With the stated structure, communication is achieved by generating the output clock signal whose frequency approximates the frequency of the necessary clock signal for the communication circuit.

Also, the communication circuit may notify the semiconductor integrated circuit of the cycle of the necessary clock signal, and the semiconductor integrated circuit may output the output clock signal by determining the values A, B, and C, based on the cycle of the clock signal that has been notified.

With the stated structure, the semiconductor integrated circuit generates the output clock signal whose frequency approximates the frequency of the necessary clock signal for the communication circuit, by determining a frequency division number based on the frequency notified by the communication circuit. Here, the frequency division number refers to the setting value by which the frequency of the clock pulse signal is divided.

BRIEF DESCRIPTION OF THE DRAWINGS

These and other objects, advantages and features of the invention will become apparent from the following description thereof taken in conjunction with the accompanying drawings that illustrate a specific embodiment of the invention.

In the drawings.

Figure 1:
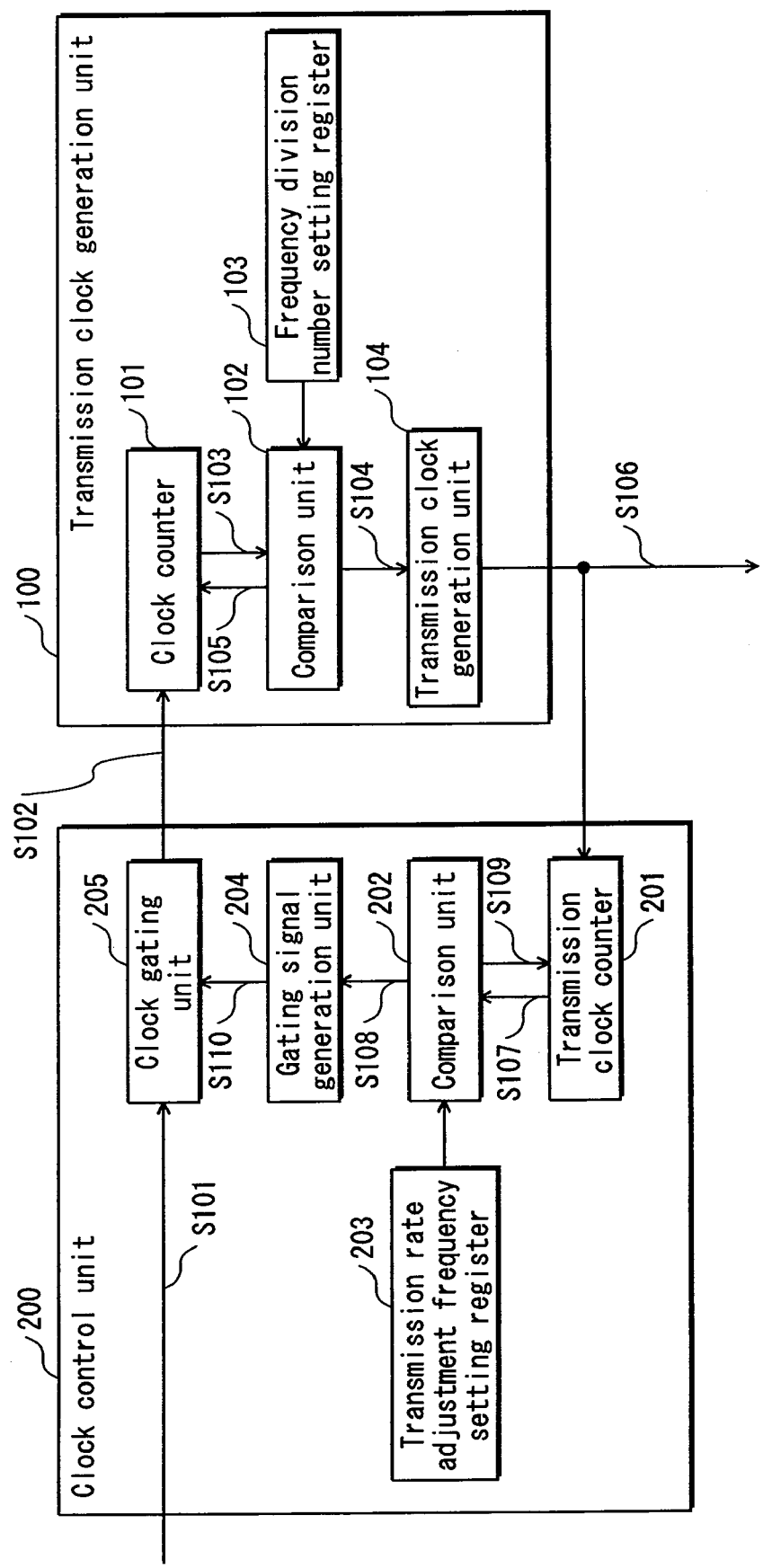
FIG. 1 is a functional block diagram showing a functional structure of a semiconductor integrated circuit according to Embodiment 1.

DESCRIPTION OF CHARACTERS 100 transmission clock generation unit
101 clock counter
102 comparison unit
103 frequency division number setting register
104 transmission clock generation unit
200, 300, 500, 700 clock control unit
201, 301, 701 transmission clock counter
202 comparison unit
203, 303 transmission rate adjustment frequency setting register
204, 304, 508 gating signal generation unit
205, 305, 509, 710 clock gating unit
306 first comparison unit
302 second comparison unit
307 transmission rate adjustment cycle setting register
501, 701 numerator setting register
502, 702 denominator setting register
503, 703 subtraction unit
504, 704 selector
505, 705 addition unit
506, 706 addition result holding buffer
507, 707 judgment unit
708 first gating signal generation unit
709 second gating signal generation unit 900 semiconductor integrated circuit
901 transmission rate adjustment circuit
902 communication unit
903 CPU
910 wireless communication device
911 antenna
912 antenna switch
913 EEPROM
914 filter
920 wireless circuit
921 reception circuit
922 transmission circuit
940 clock supply circuit

DESCRIPTION OF THE PREFERRED EMBODIMENTS

<Embodiment 1>

The following describes a semiconductor integrated circuit according to one embodiment of the present invention, and a communication device having the semiconductor integrated circuit, with reference to the drawings.

<Structure>

FIG. 1 is a functional block diagram showing a functional structure of a semiconductor integrated circuit according to Embodiment 1. The semiconductor integrated circuit is, for example, mounted in a communication device or the like, and generates a transmission clock having a frequency necessary for the communication device.

As shown in FIG. 1, the semiconductor integrated circuit includes a transmission clock generation unit 100 and a clock control unit 200.

The transmission clock control unit 100 includes a clock counter 101, a comparison unit 102, a frequency division number setting register 103, and a transmission clock generation unit 104.

The clock counter 101 counts pulses of the gated clock signal S102, and outputs a clock counter value S103 to the comparison unit 102. Also, the clock counter 101 resets the count value to zero upon receipt of a reset signal S105 from the comparison unit 102.

The comparison unit 102 compares the clock counter value S103 with a value notified by the frequency division number setting register 103. Then, only when these values match each other, the comparison unit 102 outputs to a transmission clock generation unit 104 a match signal S104 indicating the match. Also, the comparison unit 102 outputs the reset signal S105 for causing the clock counter 101 to reset the count value to zero.

The frequency division number setting register 103 holds a setting value by which the number of pulses of the gated clock signal S102 supplied from the clock control unit 200 is to be divided. The setting value is a natural number and a multiple of two. Also, the frequency division number setting register 103 notifies the comparison unit 102 of a value that is half the setting value. The setting value is set to be an arbitrary value by an operator or the like. Also, the setting value needs to be a multiple of two, so that the duration of a Hi period of an output transmission clock equals the duration of a Low period thereof.

The transmission clock generation unit 104 outputs a transmission clock signal S106 and inverts the transmission clock signal S106 at the timing of receiving the match signal S104 from the comparison unit 102. Here, to "invert" the signal means to change an output value of the transmission clock signal S106. More specifically, the transmission clock signal is a digital signal composed of two values, Hi and Low, and the signal is inverted by changing the output value from Hi to Low or from Low to Hi.

The clock control unit 200 includes a transmission clock counter 201, a comparison unit 202, a transmission rate adjustment frequency setting register 203, a gating signal generation unit 204, and a clock gating unit 205.

The transmission clock counter 201 counts the number of pulses of the transmission clock signal S106, and outputs a transmission clock counter value S107 to the comparison unit 202. Also, the transmission clock counter 201 resets the count value to zero upon receipt of a reset signal S109.

The comparison unit 202 compares the transmission clock counter value S107 with a value notified by the transmission rate adjustment frequency setting register 203. Then, only when these values match each other, the comparison unit 202 outputs to the gating signal generation unit 204 a match signal S108 indicating the match. Also, the comparison unit 202 outputs a reset signal S109 for causing the transmission clock counter 201 to reset the count value to zero.

The transmission rate adjustment frequency setting register 203 holds an arbitrary integer value that has been set by the operator or the like.

Upon receipt of the match signal S108 from the comparison unit 202, the gating signal generation unit 204 outputs to the clock gating unit 205 a mask signal S110 having a pulse duration of one clock of a clock source signal S101.

Upon receipt of a supply of the clock source signal S101 from a clock oscillator (not illustrated), the clock gating unit 205 generates the gated clock signal S102 based on the mask signal S110 from the gating signal generation unit 204. When the mask signal S110 is Hi, the gated clock signal S102 remains "Hi" although the clock source signal S101 falls. Specifically, the function of the clock gating unit 205 is realized by an OR circuit that outputs the logical OR of the clock source signal S101 and the mask signal S110.

This concludes the explanation of the components of the semiconductor integrated circuit.

With the stated structure, the semiconductor integrated circuit in the present embodiment realizes, for example, a frequency division of A+1/B by setting A in the frequency division number setting register 103 and B in the transmission rate adjustment frequency setting register 203.

Figure 2:
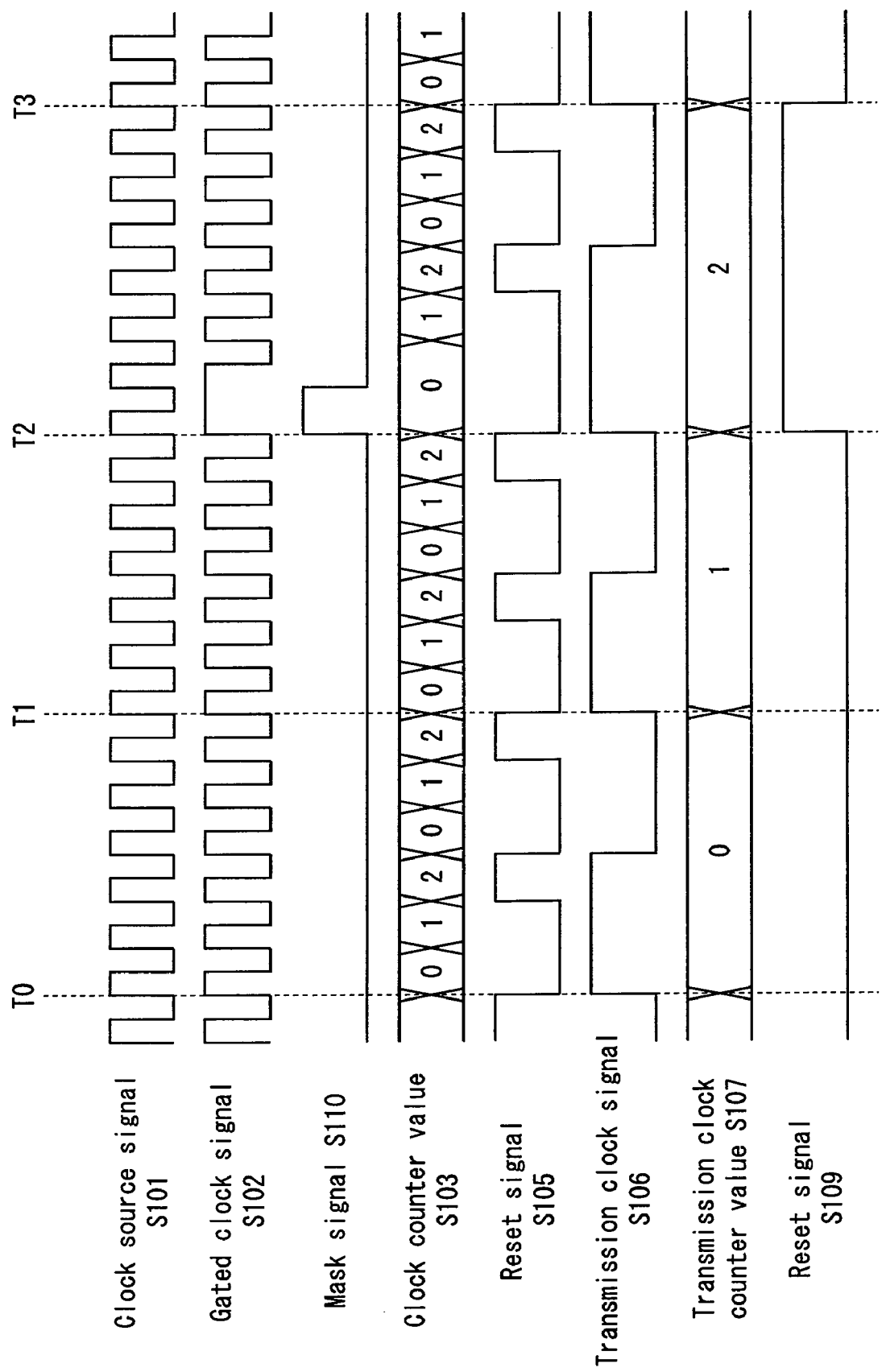
FIG. 2 is a signal waveform diagram showing a temporal change of each signal in the semiconductor integrated circuit according to Embodiment 1.

The following is a specific example of a transmission clock to be generated, with reference to FIG. 2.

FIG. 2 is a signal waveform diagram showing the waveforms of the respective signals in the case of a frequency division of approximately 6.33, namely in a case where "6" is set in the frequency division number setting register 103 and "3" is set in the transmission rate adjustment frequency setting register 203. The horizontal direction of FIG. 2 represents a time axis. In other words, in order to realize the frequency division of A+1/B, A is set in the frequency division number setting register 103 and B is set in the transmission rate adjustment frequency setting register 203. Since 6.33≈6+⅓, "6" is set in the frequency division number setting register 103 and "3" is set in the transmission rate adjustment frequency setting register 203, as described above.

FIG. 2 shows the waveforms of the clock source signal S101, the gated clock signal S102, the mask signal S110, the reset signal S105, the transmission clock signal S106, and the reset signal S109. Also, FIG. 2 shows the clock counter value S103 and the transmission clock counter value S107. As seen in FIG. 2, there are 19 pulses in the clock source signal S101, and three pulses in the transmission clock signal S106, between the times T0 and T3. Three pulses in the transmission clock signal S106 are output in response to 19 pulses in the clock source signal S101, which means that a frequency division of 19/3, namely a frequency division of 6+⅓ is realized. Note that the transmission clock signal S106 obtained by the 6.33 frequency division is generated by the repetition of the changes in the signals shown between the times T0 and T3.

When "6" is set in the frequency division number setting register 103, the value of the transmission clock signal S106 is inverted at the timing when the clock counter value S103 output from the clock counter 101 is reset from "2" to "0" (although half of 6 is 3, the clock counter value S103 is reset to "0" when the value S103 becomes "2", since the clock counter 101 counts from "0").

When the clock counter value S103 of the clock counter 101 becomes "2", the clock counter 101 receives the reset signal S105 and resets the clock counter value S103 from "2" to "0". Note that the output signal S104 of the comparison unit 102 may be any signal as long as the signal can determine the timings of rising and falling edges of the transmission clock signal S106. For example, the output signal S104 may have the same waveform as the transmission clock signal S106 or may be a pulse signal that has a rising edge at the timing of a rising or falling edge of the transmission clock signal S106.

The transmission clock counter 201 increments the transmission clock counter value S107 by one, every time a rising edge of the transmission clock signal S106 is detected. When the transmission clock counter value S107 becomes "2", the reset signal S109 is output from the comparison unit 202 at the timing shown in FIG. 2. Therefore, in response to the reset signal S109 and the next rising edge (in the time T3 in FIG. 2) of the transmission clock signal S106, the transmission clock counter 201 resets the transmission clock counter value S107 to "0".

The gating signal generation unit 204 generates the mask signal S110 upon receipt of the output signal S108 from the comparison unit 202, and outputs the mask signal S110 (see FIG. 2) to the clock gating unit 205. As shown in FIG. 2, the mask signal S110 is output for one clock of the clock source signal S101, when the transmission clock counter value S107 is "2" and at the timing of a rising edge (in the time T2 in FIG. 2) of the transmission clock signal S106. Note that the output signal S108 of the comparison unit 202 may be any signal as long as the signal can determine the timings of a rising edge and a falling edge of the mask signal S110. For example, the output signal S108 may have the same waveform as the mask signal S110 or may be a pulse signal that has a rising edge at the timing of a rising edge of the mask signal S110.

Upon receipt of the mask signal S110 and the clock source signal S101, the clock gating unit 205 outputs the gated clock signal S102 by ORing the mask signal S110 and the clock source signal S101. As shown by the time T2 in FIG. 2, the gated clock signal S102 does not fall due to the mask signal S110, although the signal S102 is supposed to fall in the same manner as the clock source signal S101. As a result, the clock counter 101 counts the pulses of the gated clock signal S102 with a delay (for one clock of the clock source signal S101). This means that the clock counter 101 counts six clocks of the gated clock signal S102 that are substantially seven clocks worth of the clock source signal S101.

Note that the transmission clock signal S106 obtained by the 6.33 frequency division is output by the repetition of the changes in the signals shown between the times T0 and T3. The transmission clock signal S106 is supplied, for example, to a communication circuit.

This concludes the explanation of the semiconductor integrated circuit according to Embodiment 1.

<Embodiment 2>

The above-described Embodiment 1 realizes the frequency division of A+1/B, but not a frequency division of A+C/B. Therefore, Embodiment 2 of the present invention provides a structure for realizing the frequency division of A+C/B. Note that A, B, and C are each assumed to be a natural number, and B>C.

<Structure>

Figure 3:
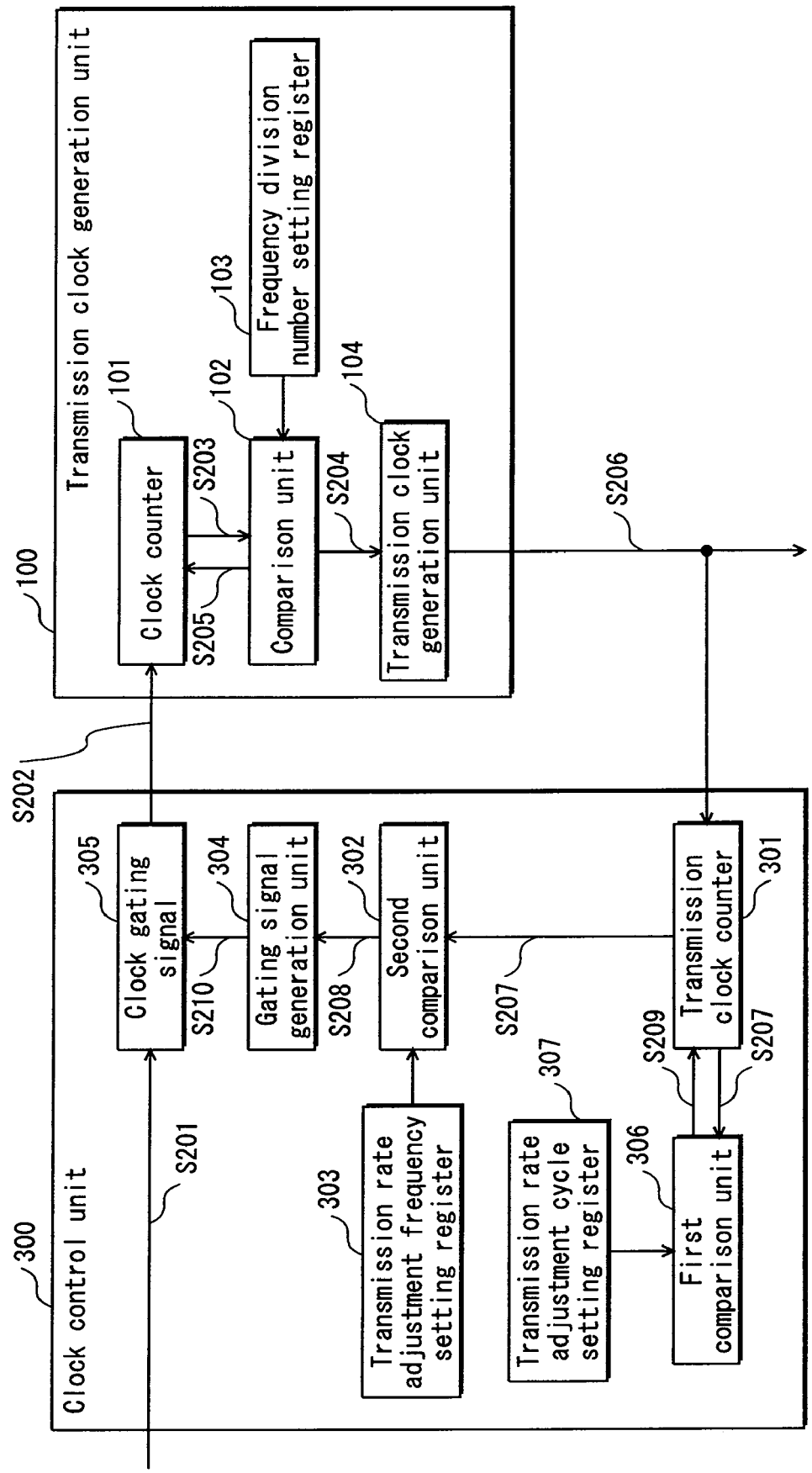
FIG. 3 is a functional block diagram showing a functional structure of a semiconductor integrated circuit according to Embodiment 2.

The following describes a functional structure of a semiconductor integrated circuit according to Embodiment 2, with reference to the functional block diagram of FIG. 3.

As shown in FIG. 3, the semiconductor integrated circuit includes the transmission clock generation unit 100 and a clock control unit 300.

The transmission clock generation unit 100 in Embodiment 2 has the same structure as that in Embodiment 1, and the functional blocks thereof achieve the same functions as those in Embodiment 1. Therefore, an explanation of the transmission clock generation unit 100 is omitted here.

As shown in FIG. 3, the clock control unit 300 includes a transmission clock counter 301, a second comparison unit 302, a transmission rate adjustment frequency setting register 303, a gating signal generation unit 304, a clock gating unit 305, a first comparison unit 306, and a transmission rate adjustment cycle setting register 307.

The transmission clock counter 301 counts pulses of a transmission clock signal S206, and outputs a transmission clock counter value S207 to the second comparison unit 302. Also, the transmission clock counter 301 resets a count value to zero upon receipt of a reset signal S209 from the first comparison unit 306.

The second comparison unit 302 compares the transmission clock counter value S207 with a value notified by the transmission rate adjustment frequency setting register 303. Then, only when these values match each other, the second comparison unit 302 outputs to the gating signal generation unit 304 a match signal S208 indicating the match.

The transmission rate adjustment frequency setting register 303 holds an arbitrary integer value set by an operator or the like, and notifies the second comparison unit 302 of the arbitrary integer value held therein.

Upon receipt of the match signal S208 from the second comparison unit 302, the gating signal generation unit 304 outputs to the clock gating unit 305 a mask signal S210 having a pulse duration of one clock of a clock source signal S201.

Upon receipt of a supply of the clock source signal S201 from a clock oscillator (not illustrated), the clock gating unit 305 generates a gated clock signal S202 based on the mask signal S210 from the gating signal generation unit 304. The gated clock signal S202 is not "Low" on a falling edge of the clock source signal S201, when the mask signal S210 is Hi. Specifically, the function of the clock gating unit 305 is realized by an OR circuit that outputs the logical OR of the clock source signal S201 and the mask signal S210.

The first comparison unit 306 compares the clock counter value S207 with a value notified by the transmission rate adjustment cycle setting register 307. Then, only when these values match each other, the first comparison unit 306 outputs to the transmission clock counter 301 the reset signal S209 indicating the match.

The transmission rate adjustment cycle setting register 307 holds an arbitrary integer value set by an operator or the like, and notifies the first comparison unit 306 of the arbitrary integer value held therein.

This concludes the explanation of the components of the clock control unit 300.

Figure 4:
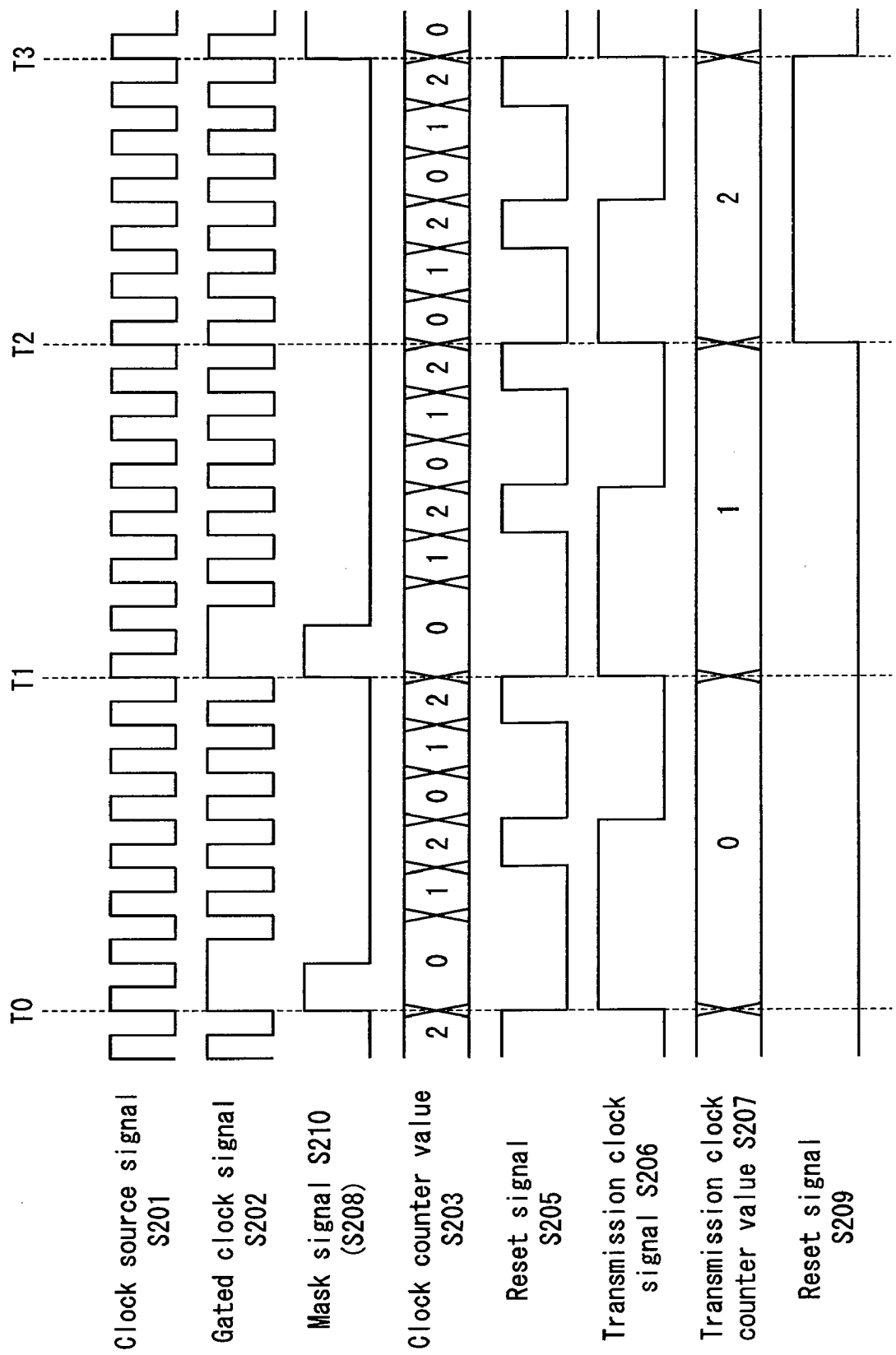
FIG. 4 is a signal waveform diagram showing a temporal change of each signal in the semiconductor integrated circuit according to Embodiment 2.

The following describes signal waveforms generated by the semiconductor integrated circuit according to Embodiment 2, with use of the specific examples shown in FIG. 4.

FIG. 4 is a signal waveform diagram showing the waveforms of the respective signals in the case of a frequency division of approximately 6.66, namely in a case where "6" is set in the frequency division number setting register 103, "2 (actually "1" since "0" is included)" is set in the transmission rate adjustment frequency setting register 303, and "3 (actually "2" since "0" is included)" is set in the transmission rate adjustment cycle setting register 307. The horizontal direction of FIG. 4 represents a time axis. In other words, when the frequency division of A+C/B is to be realized, "A" is set in the frequency division number setting register 103, "B" is set in the transmission rate adjustment frequency setting register 303, and "C" is set in the transmission rate adjustment cycle setting register 307. Since 6.66≈6+$\frac{2}{3}$, "6" is set in the frequency division number setting register 103, "3" is set in the transmission rate adjustment frequency setting register 303, and "2" is set in the transmission rate adjustment cycle setting register 307, as described above.

FIG. 4 shows the waveforms of the clock source signal S201, the gated clock signal S202, the mask signal S210, a reset signal S205, the transmission clock signal S206, and the reset signal S209. Also, FIG. 4 shows a clock counter value S203 and the transmission clock counter value S207. As seen in FIG. 4, there are 20 pulses in the clock source signal S201, and three pulses in the transmission clock signal S206, between the times T0 and T3. Three pulses in the transmission clock signal S206 are output in response to the 20 pulses in the clock source signal S201, which means that a frequency division of 20/3, namely a frequency division of 6+$\frac{2}{3}$ is realized. Note that the transmission clock signal S206 obtained by the 6.66 frequency division is generated by the repetition of the changes in the signals shown between the times T0 and T3.

When "6" is set in the frequency division number setting register 103, the value of the transmission clock signal S206 is inverted at the timing when the clock counter value S203 output from the clock counter 101 is reset from "2" to "0" (although half of 6 is 3, the clock counter value S203 is reset to "0" when the value S203 becomes "2", since the clock counter 101 counts from "0").

When the clock counter value S203 of the clock counter 101 becomes "2", the clock counter 101 receives the reset signal S205 and resets the clock counter value S203 from "2" to "0". Note that the output signal S204 of the comparison unit 102 may be any signal as long as the signal can determine the timings of a rising edge and a falling edge of the transmission clock signal S206. For example, the output signal S204 may have the same waveform as the transmission clock signal S206 or may be a pulse signal that has a rising edge at the timing of a rising edge or a falling edge of the transmission clock signal S206.

The transmission clock counter 301 increments the transmission clock counter value S207 by one every time a rising edge of the transmission clock signal S206 is detected. When the transmission clock counter value S207 becomes "2", the reset signal S209 is output from the comparison unit 202 at the timing shown in FIG. 4. Therefore, in response to the reset signal S209 and the next rising edge (in the time T3 in FIG. 4) of the transmission clock signal S206, the transmission clock counter 301 resets the transmission clock counter value S207 to "0".

The gating signal generation unit 304 generates the mask signal S210 upon receipt of the output signal S208 from the second comparison unit 302, and outputs the mask signal S210 (see FIG. 4) to the clock gating unit 305. As shown in FIG. 4, the mask signal S210 is output for one clock of the clock source signal S201, when the transmission clock counter value S207 is less than "2" and at the timing of a rising edge (in the times T1 and T2 in FIG. 4) of the transmission clock signal S206. Note that the output signal S208 of the second comparison unit 302 may be any signal as long as the signal can determine the timings of a rising edge and a falling edge of the mask signal S210. For example, the output signal S208 may have the same waveform as the mask signal S210 or may be a pulse signal that has a rising edge at the timing of a rising edge of the mask signal S210.

Upon receipt of the mask signal S210 and the clock source signal S201, the clock gating unit 305 outputs the gated clock signal S202 by ORing the mask signal S210 and the clock source signal S201. As shown by the times T1 and T2 in FIG. 4, the gated clock signal S202 does not fall due to the mask signal S210, although the gated clock signal S202 is supposed to fall in the same manner as the clock source signal S201. As a result, the clock counter 101 counts the pulses of the gated clock signal S202 with a delay (for one clock of the clock source signal S201). This means that the clock counter 101 counts six clocks of the gated clock signal S202 that are substantially seven clocks worth of the clock source signal S201.

Note that the transmission clock signal S206 obtained by the 6.66 frequency division is output by the repetition of the changes in the signals shown between the times T0 and T3. The transmission clock signal S206 is supplied, for example, to a communication circuit.

This concludes the explanation of the semiconductor integrated circuit according to Embodiment 2.

<Embodiment 3>

In the methods shown in the above-described Embodiments 1 and 2, a difference between an ideal clock and a transmission clock to be generated may become large. Therefore, in Embodiment 3, an explanation is provided of a structure for further approximating the transmission clock to the ideal clock.

<Structure>

Figure 5:
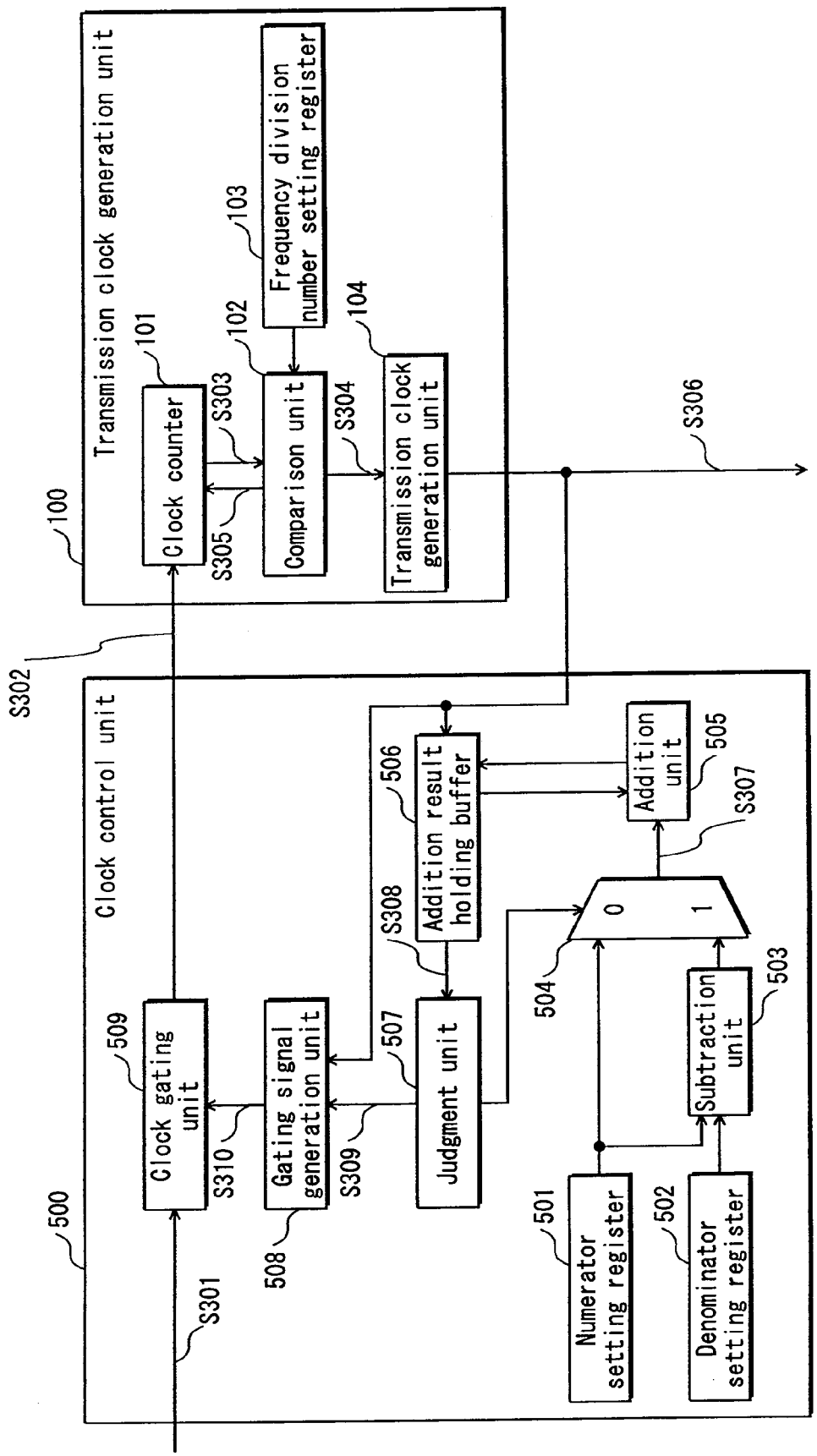
FIG. 5 is a functional block diagram showing a functional structure of a semiconductor integrated circuit according to Embodiment 3.

The following describes a functional structure of a semiconductor integrated circuit according to Embodiment 3, with reference to the functional block diagram of FIG. 5.

As shown in FIG. 5, the semiconductor integrated circuit includes the transmission clock generation unit 100 and a clock control unit 500.

The transmission clock generation unit 100 in Embodiment 3 has the same structure as that in Embodiment 1, and the functional blocks thereof achieve the same functions as those in Embodiment 1. Therefore, an explanation of the transmission clock generation unit 100 is omitted here.

The clock control unit 500 includes a numerator setting register 501, a denominator setting register 502, a subtraction unit 503, a selector 504, an addition unit 505, an addition result holding buffer 506, a judgment unit 507, a gating signal generation unit 508, and a clock gating unit 509.

The numerator setting register 501 is a register in which a value of "C" is set when a frequency division of A+C/B is executed. Note that A, B, and C are each assumed to be a natural number, and B>C. The numerator setting register 501 outputs a value held therein to the subtraction unit 503 and the selector 504.

The denominator setting register 502 is a register in which a value of "B" is set when the frequency division of A+C/B is executed. Note that A, B, and C are each assumed to be a natural number, and B>C. The denominator setting register 502 outputs a value held therein to the subtraction unit 503.

Note that a value of "A" is set in the frequency division number setting register 103 of the transmission clock generation unit 100.

The subtraction unit 503 subtracts the value output from the denominator setting register 502, from the value output from the numerator setting register 501. Then, the subtraction unit 503 outputs a result of the subtraction to the selector 504.

The selector 504 outputs to the addition unit 505 one of (i) the value output from the numerator setting register 501 and (ii) the value output from the subtraction unit 503, according to an instruction from the judgment unit 507. Specifically, when a signal sent from the judgment unit 507 is "Hi", the selector 504 outputs the value output from the subtraction unit 503 to the addition unit 505. When a signal sent from the judgment unit 507 is "Low", the selector 504 outputs the value output from the numerator setting register 501 to the addition unit 505.

The addition unit 505 overwrites an addition value held by the addition result holding buffer 506 with a new addition value obtained by adding a value output from the selector 504 to a value output from the addition result holding buffer 506.

The addition result holding buffer 506 holds an addition value written by the addition unit 505, and outputs the addition value to the judgment unit 507 and the addition unit 505, at the timing when a rising edge of the transmission clock signal S306 is detected.

Upon receiving from the addition result holding buffer 506 a notification of the addition value held by the addition result holding buffer 506, the judgment unit 507 judges whether the addition value is greater than zero, namely whether the addition value is greater than or equal to one. Then, the judgment unit 507 outputs a comparison judgment signal S309 to the selector 504 and the gating signal generation unit 508. The comparison judgment signal S309 indicates "Hi" when the value is greater than zero and "Low" when the value is not greater than zero.

The gating signal generation unit 508 receives, from the judgment unit 507, a supply of the comparison judgment signal S309 and the transmission clock signal S306. Then, at the timing when both of the signals S309 and S306 are Hi, the gating signal generation unit 508 outputs to the clock gating unit 509 the mask signal S310 having a pulse duration of one clock of a clock source signal S301.

The clock gating unit 509 outputs a gated clock signal S302 upon receipt of a supply of (i) the mask signal S310 from the gating signal generation unit 508 and (ii) the clock source signal S301. More specifically, the clock gating unit 509 ORs the clock source signal S301 and the mask signal S310, thereby outputting the gated clock signal S302 that is not "Low" on a falling edge of the clock source signal S301, when the mask signal S310 is "Hi".

This concludes the explanation of the components of the clock control unit 500.

Figure 6:
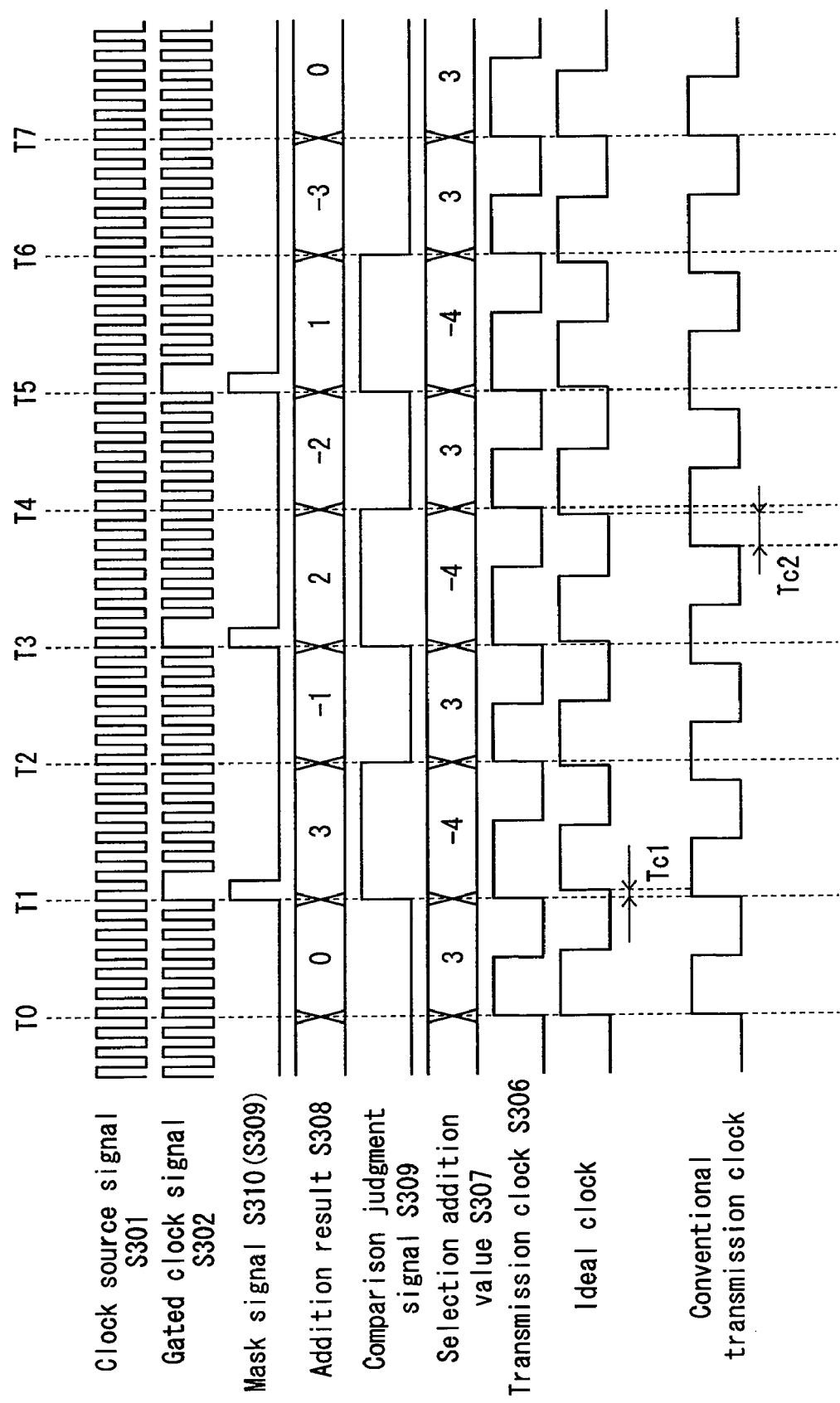
FIG. 6 is a signal waveform diagram showing a temporal change of each signal in the semiconductor integrated circuit according to Embodiment 3.

The following describes signal waveforms generated by the semiconductor integrated circuit according to Embodiment 3, with use of the specific examples shown in FIG. 6.

FIG. 6 is a signal waveform diagram showing the waveforms of the respective signals in the case of a frequency division of approximately 6.43, namely in a case where "6" is set in the frequency division number setting register 103, "3" is set in the numerator setting register 501, and "7" is set in the denominator setting register 502. The horizontal direction of FIG. 6 represents a time axis. In other words, when the frequency division of A+C/B is to be realized, "A" is set in the frequency division number setting register 103, "C" is set in the numerator setting register 501, and "B" is set in the denominator setting register 502. Since 6.43≈6+3/7, "6" is set in the frequency division number setting register 103, "3" is set in the numerator setting register 501, and "7" is set in the denominator setting register 502, as described above.

FIG. 6 shows the waveforms of the clock source signal S301, the gated clock signal S302, the mask signal S310, the comparison judgment signal S309, the transmission clock signal S306, an ideal clock, and a conventional transmission clock. Also, FIG. 6 shows an addition result S308 and a selection addition value S307.

As seen in FIG. 6, there are 45 pulses in the clock source signal S301, and seven pulses in the transmission clock signal S306, between the times T0 and T7. Seven pulses in the transmission clock signal S306 are output in response to the 45 pulses in the clock source signal S301, which means that a frequency division of 45/7, namely a frequency division of 6+3/7 is realized. Note that the transmission clock signal S306 obtained by the 6.43 frequency division is generated by the repetition of the changes in the signals shown between the times T0 and T7.

Note that although not shown in FIG. 6, a clock counter value S303 is reset to "0" every time the value S303 becomes "2", so that one pulse of the transmission clock signal S306 is generated for each six clocks of the gated clock signal S302.

At the time T0 in FIG. 6, the addition result holding buffer 506 holds "0". In response to the rising edge of the transmission clock signal S306 at the time T0, the addition result holding buffer 506 outputs the value "0" held therein to the judgment unit 507 and the addition unit 505.

The judgment unit 507 judges that the value "0" output from the addition result holding buffer 506 is not greater than "0", and outputs "Low" to the selector 504. Also, the judgment unit 507 outputs a mask signal that causes the gating signal generation unit 508 to mask one clock of the clock source signal S301.

Upon receipt of "Low" from the judgment unit 507, the selector 504 outputs "3" that is an output from the numerator setting register 501.

The addition unit 505 adds the output value "3" from the selector 504 to the output value "0" from the addition result holding buffer 506, and overwrites the addition value held by the addition result holding buffer 506 with the value "3" obtained by the addition.

When the transmission clock signal S306 rises at the time T1 and the mask signal S310 becomes "Hi", the clock source signal S301 is masked by the clock gating unit 509, and whereby the gated clock signal S302 is output.

When the transmission clock signal S306 rises at the time T1, the addition result holding buffer 506 outputs the value "3" held therein to the judgment unit 507 and the addition unit 505.

The judgment unit 507 judges that the value "3" output from the addition result holding buffer 506 is greater than "0", and outputs "Hi" to the selector 504.

Upon receipt of "Hi" from the judgment unit 507, the selector 504 outputs "−4" output from the subtraction unit 503.

The addition unit 505 adds the output value "−4" from the selector 504 to the output value "3" from the addition result holding buffer 506, and overwrites the addition value held by the addition result holding buffer 506 with the value "−1" obtained by the addition.

At the time T2, the clock source signal S301 is not masked although the transmission clock signal S306 rises, since the comparison judgment signal S309 is "Low".

Thereafter, every time the transmission clock signal S306 rises, the following operations are performed: judgment by the judgment unit 507; addition by the addition unit 503; and masking by the clock gating unit 510 depending on whether the mask signal is "Hi". The addition result S308 is "0" between the times T0 and T1 and returns to "0" at the time T7. Therefore, the time period from the times T0 to T1 is set as one cycle, and this cycle is repeated.

The transmission clock signal S306 obtained by the 6.43 frequency division is output by the repetition of the changes in the signals shown between the times T0 and T7. The transmission clock signal S306 is supplied, for example, to a communication circuit.

As shown in FIG. 6, the mask signal S310 becomes "Hi" at a substantially equal timing between the times T0 and T7. In this way, a maximum deviation (deviation amount Tc1) between the generated transmission clock signal S206 and the ideal clock signal is greatly decreased compared to a maximum deviation (deviation amount Tc2) between a conventional transmission clock signal and the ideal clock signal.

This concludes the explanation of the semiconductor integrated circuit according to Embodiment 3.

<Embodiment 4>

The above-described Embodiment 3 realizes A+C/B frequency division only when "A" is a multiple of two. This is because a count value when the transmission clock is "Hi" is set to be the same as a count value when the transmission clock is "Low", so that a Hi period during which the transmission clock S306 is "Hi" and a Low period during which the transmission clock S306 is "Low" are set as evenly as possible. Therefore, in Embodiment 4, a description is provided of a case where "A" is set to an odd number.

<Structure>

Figure 7:
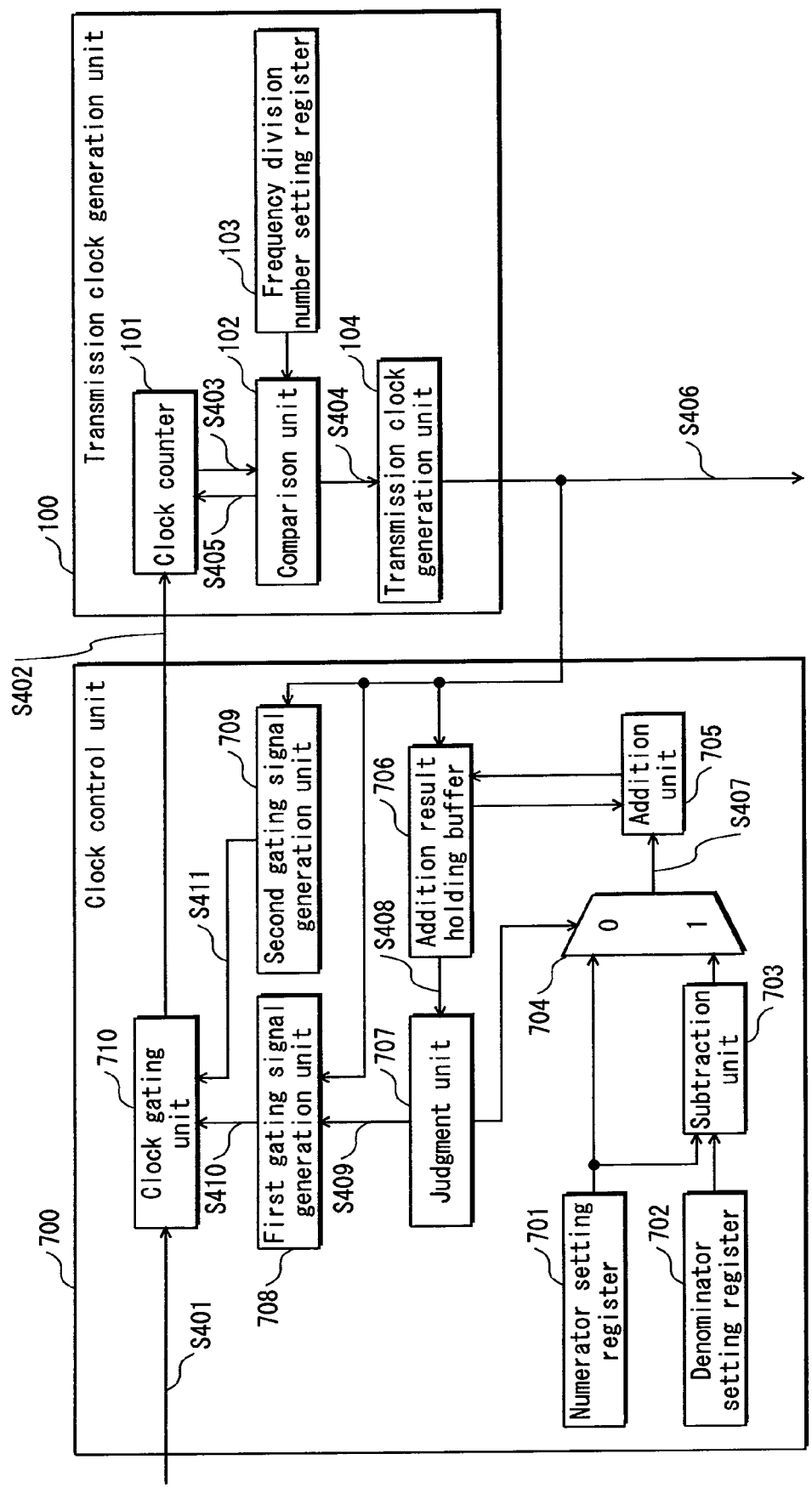
FIG. 7 is a functional block diagram showing a functional structure of a semiconductor integrated circuit according to Embodiment 4.

The following describes a functional structure of a semiconductor integrated circuit according to Embodiment 4, with reference to the functional block diagram of FIG. 7.

As shown in FIG. 7, the semiconductor integrated circuit includes the transmission clock generation unit 100 and a clock control unit 700.

The transmission clock generation unit 100 in Embodiment 1 has the same structure as that in Embodiment 1, and the functional blocks thereof achieve the same functions as those in Embodiment 1. Therefore, an explanation of the transmission clock generation unit 100 is omitted here.

The clock control unit 700 includes a numerator setting register 701, a denominator setting register 702, a subtraction unit 703, a selector 704, an addition unit 705, an addition result holding buffer 706, a judgment unit 707, a first gating signal generation unit 708, a second gating signal generation unit 709, and a clock gating unit 710.

The numerator setting register 701 is a register in which a value of "C" is set when a frequency division of A+C/B is executed. Note that A, B, and C are each assumed to be a natural number, and B>C. The numerator setting register 701 outputs a value held therein to the subtraction unit 703 and the selector 704.

The denominator setting register 702 is a register in which a value of "B" is set when the frequency division of A+C/B is executed. Note that A, B, and C are each assumed to be a natural number, and B>C. The denominator setting register 702 outputs a value held therein to the subtraction unit 703.

Note that a value of "A" is set in the frequency division number setting register 103 of the transmission clock generation unit 100.

The subtraction unit 703 subtracts the value output from the denominator setting register 702, from the value output from the numerator setting register 701. Then, the subtraction unit 703 outputs to the selector 704 a value obtained by the subtraction.

The selector 704 outputs to the addition unit 705 one of (i) the value output from the numerator setting register 701 and (ii) the value output from the subtraction unit 703, according to an instruction from the judgment unit 707. Specifically, when a signal sent from the judgment unit 707 is "Hi", the selector 704 outputs to the addition unit 705 the value output from the subtraction unit 703. When a signal sent from the judgment unit 707 is "Low", the selector 704 outputs to the addition unit 705 the value output from the numerator setting register 701.

The addition unit 705 overwrites the addition value held by the addition result holding buffer 706 with an addition value obtained by adding a value output from the selector 704 to a value output from the addition result holding buffer 706.

The addition result holding buffer 706 holds an addition value written by the addition unit 705, and outputs the addition value to the judgment unit 707 and the addition unit 705, at the timing when a rising edge of the transmission clock signal S406 is detected.

Upon receiving from the addition result holding buffer 706 a notification of an addition value held by the addition result holding buffer 706, the judgment unit 707 judges whether the addition value is greater than zero, namely whether the addition value is greater than or equal to one. Then, the judgment unit 707 outputs a comparison judgment signal S409 to the selector 704 and the first gating signal generation unit 708. The comparison judgment signal S409 indicates "Hi" when the addition value is greater than zero and "Low" when the addition value is not greater than zero.

The first gating signal generation unit 708 receives, from the judgment unit 707, a supply of the comparison judgment signal S409 and the transmission clock signal S406. Then, at the timing when both of the signals S409 and S406 are Hi, the first gating signal generation unit 708 outputs to the clock gating unit 710 a mask signal S410 having a pulse duration of one clock of a clock source signal S401.

The second gating signal generation unit 709 receives the transmission clock signal S406, and detects a negative edge of the transmission clock signal S406, namely a falling edge of the transmission clock signal S406. Then, at the timing of the detection of a falling edge of the transmission clock signal S406, the second gating signal generation unit 709 outputs to the clock gating unit 710 a mask signal S411 that becomes "Hi" for one clock of the clock source signal S401.

The clock gating unit 710 outputs a gated clock signal S402 upon receipt of a supply of (i) the mask signal S410 from the first gating signal generation unit 708 and (ii) the clock source signal S401. More specifically, the clock gating unit 710 ORs the clock source signal S401, the mask signal S410, and the mask signal S411, thereby outputting the gated clock signal S402 that is not "Low" on a falling edge of the clock source signal S401, when the mask signals S410 and S411 are "Hi".

This concludes the explanation of the components of the clock control unit 700. The clock control unit 700 is substantially different from the clock control unit 500 in Embodiment 3 with respect to the second gating signal generation unit S709, and a gated clock signal generated by the clock gating unit 710.

Figure 8:
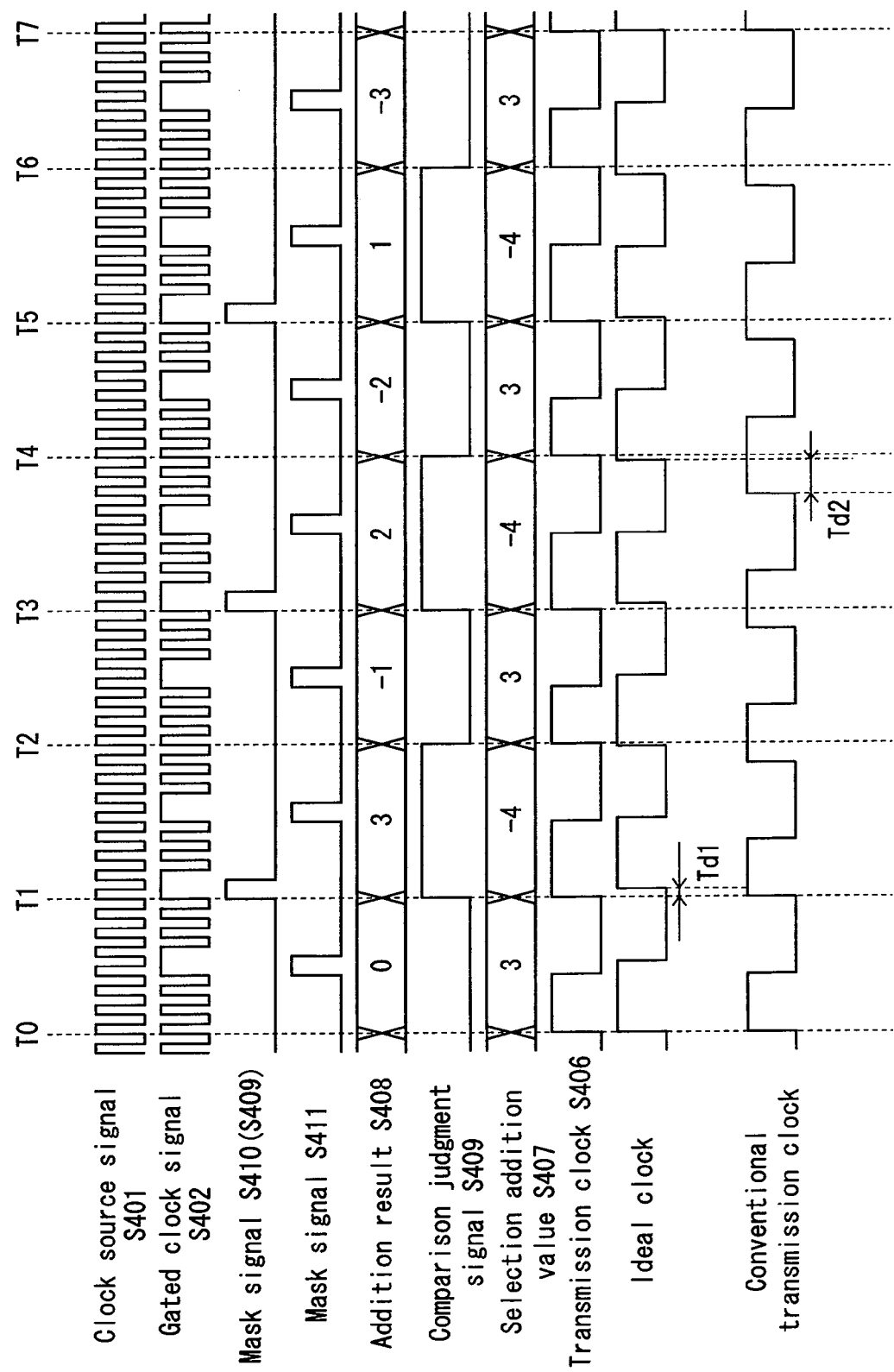
FIG. 8 is a signal waveform diagram showing a temporal change of each signal in the semiconductor integrated circuit according to Embodiment 4.

The following describes signal waveforms generated by the semiconductor integrated circuit according to Embodiment 4, with use of the specific examples shown in FIG. 8.

FIG. 8 is a signal waveform diagram showing the waveforms of the respective signals in the case of a frequency division of approximately 7.43, namely in a case where "7" is set in the frequency division number setting register 103, "3" is set in the numerator setting register 701, and "7" is set in the denominator setting register 702. The horizontal direction of FIG. 8 represents a time axis. In other words, when the frequency division of A+C/B is to be realized, "A" is set in the frequency division number setting register 103, "C" is set in the numerator setting register 701, and "B" is set in the denominator setting register 702. Since 7.43≈7+3/7, "7" is set in the frequency division number setting register 103, "3" is set in the numerator setting register 701, and "7" is set in the denominator setting register 702, as described above.

FIG. 8 shows the waveforms of the clock source signal S401, the gated clock signal S402, the mask signal S410, the mask signal S411, the comparison judgment signal S409, the transmission clock signal S406, an ideal clock, and a conventional transmission clock. Also, FIG. 8 shows an addition result S408 and a selection addition value S407.

Embodiment 4 is different from Embodiment 3 with respect to the second gating signal generation unit 709 and an operation of the clock gating unit 710. Therefore, an explanation is provided of the mask signal S411 output from the second gating signal generation unit 709 and the gated clock signal S402 output from the clock gating unit 710.

As shown in FIG. 8, upon detection of a falling edge of the transmission clock signal S406, the second gating signal generation unit 709 sets the mask signal S411 to "Hi" for one clock of the clock source signal S401.

The clock gating unit 710 outputs the gated clock signal S402 generated by masking the clock source signal S401 at the timings when the mask signal S410 is high and when the mask signal S411 is high.

The gated clock signal S402 is generated by masking the clock source signal S401 ten times in total between the times T0 and T7. As seen in FIG. 8, there are 52 pulses in the clock source signal S401 and seven pulses in the transmission clock signal S406, between the times T0 and T7. Seven pulses in the transmission clock signal S406 are output in response to the 52 pulses in the clock source signal S401, which means that a frequency division of 52/7, namely a frequency division of 7.43 is realized. As shown in FIG. 8, the timing of masking is substantially equal between the times T0 and T7. In this way, a maximum deviation (deviation amount Td1) between the transmission clock signal S406 and the ideal clock signal is greatly decreased compared to a maximum deviation (deviation amount Td2) between a conventional transmission clock signal and the ideal clock signal, as clearly seen in FIG. 8. Note that the signal waveforms shown between the times T0 and T7 are repeated.

<Embodiment 5>

In Embodiment 5, an explanation is provided of use of each semiconductor integrated circuit as shown in Embodiments 1 to 4.

Figure 9:
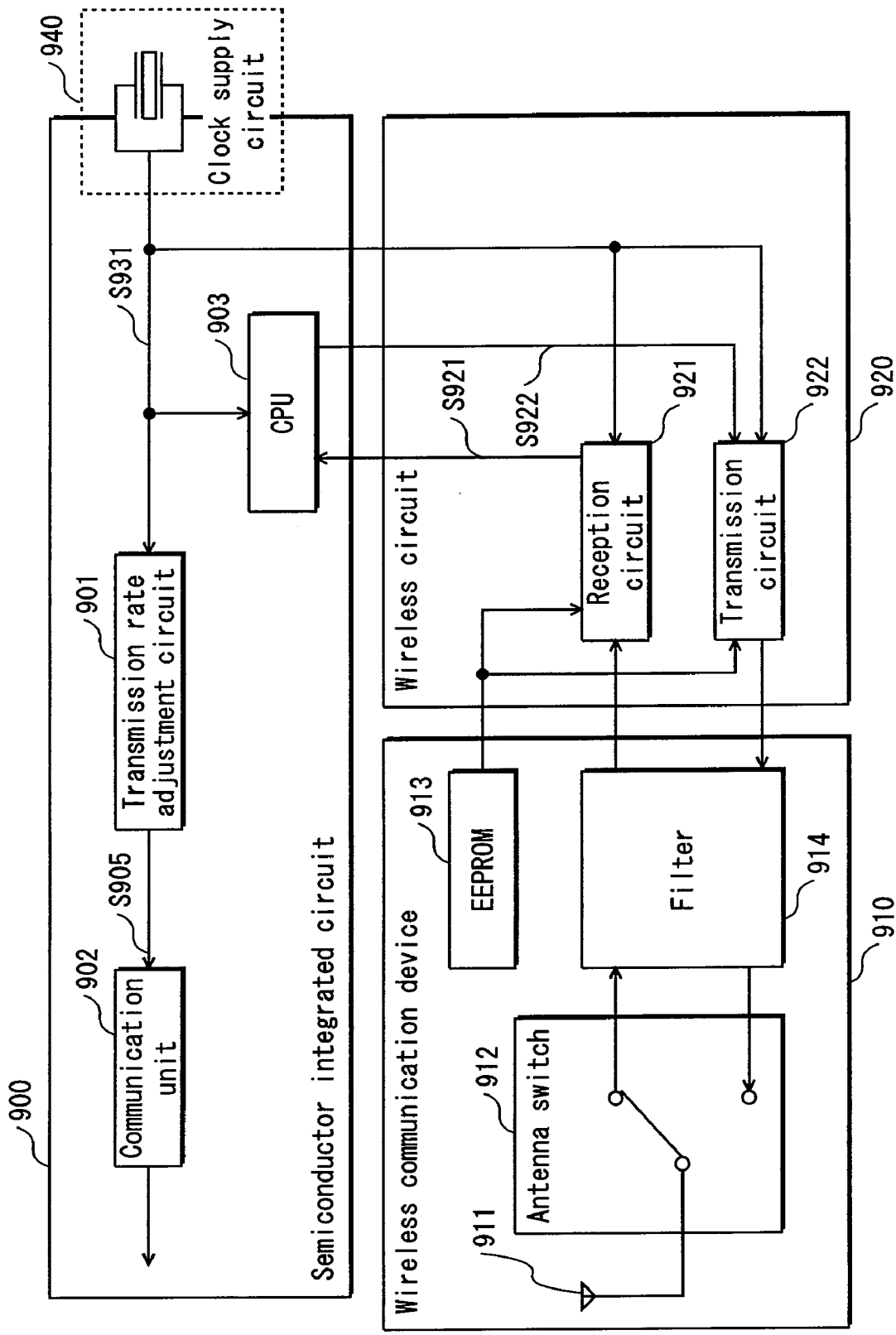
FIG. 9 is a functional block diagram showing a functional structure of a communication device that uses a semiconductor integrated circuit in Embodiment 5.

FIG. 9 is a functional block diagram showing a functional structure of a communication device in which the semiconductor integrated circuit is mounted.

As shown in FIG. 9, the communication device includes a semiconductor integrated circuit 900, a wireless communication device 910, a wireless circuit 920, and a clock supply circuit 940.

The semiconductor integrated circuit 900 includes a transmission rate adjustment circuit 901, a communication circuit 902, and a CPU 903.

The transmission rate adjustment circuit 901 may be any of the semiconductor integrated circuits in Embodiments 1 to 4. The transmission rate adjustment circuit 901 receives a supply of a clock source signal from the clock supply circuit 940, generates a transmission clock having a desired frequency, and outputs the transmission clock to the communication circuit 902.

The communication circuit 902 operates in accordance with the transmission clock output from the transmission rate adjustment circuit 901, and communicates with an external device (not shown).

The CPU 903 operates upon receipt of the clock source signal from the clock supply circuit 940. The CPU 903 receives a reception data signal S921 from the wireless circuit 920, and outputs a transmission data signal S922 to the wireless circuit 920.

The wireless communication device 910 includes an antenna 911, an antenna switch 912, an EEPROM 913, and a filter 914.

The antenna 911 receives a signal, and transmits the signal to the antenna 912. Also, the antenna 911 transmits a signal supplied from the antenna switch 912.

The EEPROM (Electrically Erasable and Programmable Read-Only Memory) 913 is a nonvolatile memory that stores setting information and such that relate to a communication setting of the wireless circuit 920. The setting information is written into a reception circuit 921 and a transmission circuit 922.

The antenna switch 912 is provided to switch between transmission and reception. In a case where the antenna 911 receives a signal, the antenna switch 912 turns on a switch connecting to the reception circuit 921. In a case where the antenna 911 transmits a signal, the antenna switch 912 turns on a switch connecting to the transmission circuit 922.

The filter 914 cuts a frequency component other than (i) a desired frequency of the reception signal input into the reception circuit 921 and (ii) a desired frequency of the transmission signal output from the transmission circuit 922.

The wireless circuit 920 includes the reception circuit 921 and the transmission circuit 922.

The reception circuit 921 uses a clock signal S931 to demodulate a signal that has been received wirelessly, and outputs the reception data signal S921 to the CPU 303.

The transmission circuit 922 uses the clock signal S931 to modulate the transmission data signal S922 received from the CPU 303 into a wireless signal for transmission, and outputs the wireless signal to the wireless communication device 910.

The clock supply circuit 940 outputs the clock signal S931 to the transmission rate adjustment circuit 901 and the CPU 903 in the semiconductor integrated circuit 900, and to the reception circuit 921 and the transmission circuit 922 in the wireless circuit 920.

This concludes the explanation of the components of the communication device.

<Operation>

The following describes one example of an operation of the above-described communication device.

First, a data setting of the wireless circuit 920 is performed via EEPROM 913, thereby configuring necessary settings for wireless communication.

Thereafter, the reception circuit 921 operates to perform a carrier detection to determine whether or not a wireless reception signal exists in a desired frequency band. If the wireless reception signal exists in the desired frequency band, the reception circuit 921 judges whether or not an address of the wireless reception signal matches a set address of the reception circuit 921 itself. If the address matches the set address, the reception circuit 921 performs a reception operation on the wireless reception signal so as to obtain the reception data signal S921. Then, the reception circuit 921 transmits the reception data signal S921 to the CPU 903.

Upon receipt of the reception data signal S921, the CPU 903 outputs the necessary transmission data signal S922 to the transmission circuit 922. The transmission circuit 922 performs a transmission operation on a wireless transmission signal to obtain a wireless radio wave. When the antenna switch 912 is switched to the transmission side, the antenna 911 transmits the wireless radio wave.

In the case of performing a serial communication with use of a transmission clock signal generated by dividing the frequency of the same clock signal S931 during a series of the above-described wireless communication operations, one of the semiconductor integrated circuits in Embodiments 1, 2, 3, and 4 is mounted as the transmission rate adjustment circuit. When mounted, the semiconductor integrated communication circuit performs the serial communication by generating a clock signal having a predetermined transmission rate, and outputting the clock signal to the communication circuit 902.

With the above-described processing and the incorporation of the transmission rate adjustment methods in Embodiments 1, 2, 3, and 4 into the wireless communication device, a clock signal having a transmission rate that cannot be set by a frequency division circuit alone is generated by averaging a transmission clock signal having a long cycle and a transmission clock signal having a regular cycle. As a result, a phase difference between an ideal clock signal having a predetermined transmission rate and a transmission clock signal is decreased as compared to conventional techniques.

<Supplemental Remarks>

Although the present invention has been explained based on the above embodiments, the present invention is of course not limited to these embodiments. For example, the following variations are construed as being included as the technical idea of the present invention.

(1) In Embodiments 3 and 4 described above, the initial value of the addition result holding buffer 506 is zero, and a value targeted for the comparison of the judgment unit is zero. However, these values do not always need to be zero. It is acceptable as long as the following expression is satisfied: $X-(B-C)<Y\leq X+C$ where X denotes the value targeted for the comparison, Y denotes the initial value set in the addition result holding buffer 506, C denotes a value set in the numerator setting, register 501, and B denotes a value set in the denominator setting register 502.

(2) In Embodiment 5 described above, a device having the semiconductor integrated circuit is exemplified by the communication device. However, a device having the semiconductor integrated circuit is not limited to the communication device. The semiconductor integrated circuit may be any device that needs a plurality of clock signals each having a different frequency.

(3) In Embodiment 5 described above, the number of frequency division set in the transmission rate adjustment circuit 901 may be set by an operator. Alternatively, it is possible to have the following structure. That is, the communication circuit 902 notifies the transmission rate adjustment circuit 901 of a clock having a desired frequency. Then, the number of frequency division may be determined from the desired frequency and the frequency of the clock signal S931 supplied from the clock supply circuit 940. Then, the number of frequency division that has been determined may be set to each register.

(4) The semiconductor integrated circuits in the above-described embodiments, and the functional parts of the communication device may each be realized by one or more LSIs (Large Scale Integrated circuits). Also, two or more of the functional parts may be realized by one LSI.

Also, a method for integrating circuits is not limited to an LSI, and may be realized by a dedicated circuit or a general processing unit. It is possible to use a reconfigurable processor that allows the reconfiguration of the connection and setting of circuit cells in the LSI. Such a reconfigurable processor is represented by an FPGA (Field Programmable Gate Array) that is programmable after the LSI is produced.

Furthermore, if a technology of integration that can substitute for the LSI appears by a progress of semiconductor technology or another derivational technology, it is possible to integrate the function blocks by using the technology. A possible field for integrating the function blocks can be an adaptation of biotechniques.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A semiconductor integrated circuit comprising:
   a clock control unit configured to output a gated clock signal generated by masking an input clock signal for a predetermined period starting from each predetermined timing;
   a signal output unit configured to output one pulse of an output clock signal each time a number of pulses of the gated clock signal reaches a predetermined count; and
   three registers that hold therein values A, B, and C, respectively, wherein:
   the values A, B, and C are each a natural number, and B>C,
   the clock control unit determines each of predetermined timings based on the value B and the value C,
   the predetermined count is equal to the value A,
   the semiconductor integrated circuit divides a frequency of the input clock signal by A+C/B.

2. The semiconductor integrated circuit of claim 1, wherein:
   the clock control unit includes:
      a selector operable to select and output one of (i) the value C and (ii) a subtraction value obtained by subtracting the value B from the value C;
      an addition result holding buffer that holds therein an addition value, and that is operable to output the addition value at a rising edge of the output clock signal;
      an addition circuit operable to overwrite the addition value held by the addition result holding buffer, with a new addition value obtained by adding the value output from the selector to the addition value output from the addition result holding buffer;
      a judgment subunit operable to judge, when the addition result holding buffer outputs the addition value, whether the addition value is greater than a reference value X; and
      a gated clock output subunit operable to output the gated clock signal generated by masking one clock of the input clock signal, when the addition value is judged to be greater than the reference value X,
   the selector selects and outputs the subtraction value when the addition value is judged to be greater than the reference value X, and selects and outputs the value C when the addition value is judged to be equal to or less than the reference value X,
   each of the predetermined timings is at a rising edge of the output clock signal and when the addition value held by the addition result holding buffer is greater than the reference value X,
   an initial value Y of the addition result holding buffer satisfies $(X-(B-C))<Y\leq(X+C)$, the signal output unit includes:
- a gated clock counter operable to count the pulses of the gated clock signal supplied from the clock control unit;
- a division number setting register that is one of the three registers and holds therein the value A as a setting value by which the gated clock signal is to be divided; and
- an output subunit operable to output the output clock signal by inverting a value of the output clock signal when a count value of the gated clock counter matches a value that is half the setting value set in the division number setting register.

3. The semiconductor integrated circuit of claim 2, wherein:
the clock control unit further includes:
- a first setting register that is one of the three registers and holds therein the value C as a first setting value;
- a second setting register that is one of the three registers and holds therein the value B as a second setting value; and
- a subtraction circuit operable to subtract the second setting value from the first setting value, and
the selector selects and outputs one of the first setting value and the subtraction value.

4. The semiconductor integrated circuit of claim 3, wherein the gated clock output subunit is further operable to mask one clock of the input clock signal at a falling edge of the output clock signal.

5. The semiconductor integrated circuit of claim 1, wherein:
the value C is equal to one,
the clock control unit includes:
- a division clock counter operable to count pulses of the output clock signal output from the signal output unit;
- a first setting register that is one of the three registers and holds therein the value B as a first setting value based on a count value of the division clock counter, the first setting value being for determining each of the predetermined timings of masking the input clock signal; and
- a gated clock output subunit operable to output the gated clock signal generated by masking the input clock signal when the count value of the division clock counter matches the first setting value,
the signal output unit includes:
- a gated clock counter operable to count the pulses of the gated clock signal supplied from the clock control unit;
- a division number setting register that is one of the three registers and holds therein the value A as a setting value by which the gated clock signal is to be divided; and
- an output subunit operable to output the output clock signal by inverting a value of the output clock signal when a count value of the gated clock counter matches a value that is half the setting value set in the division number setting register, and
each of the predetermined timings is when the count value of the division clock counter matches the first setting value.

6. The semiconductor integrated circuit of claim 5, wherein:
the gated clock counter resets the count value thereof when the counter value matches the setting value set in the division number setting register, and
the division clock resets the count value thereof when the counter value matches the first setting value.

7. The semiconductor integrated circuit of claim 1, wherein:
the clock control unit includes:
- a division clock counter operable to count pulses of the output clock signal output from the signal output unit;
- a first setting register that is one of the three registers and holds therein the value C as a first setting value based on a count value of the division clock counter, the first setting value being for determining each of the predetermined timings of masking the input clock signal;
- a second setting register that is one of the three registers and holds therein the value B as a second setting value used to determine a timing of resetting the division clock counter; and
- a gated clock output subunit operable to output the gated clock signal generated by masking the input clock signal when the count value of the division clock counter is less than the first setting value,
the division clock counter resets the count value thereof when the count value thereof matches the second setting value,
the signal output unit includes:
- a gated clock counter operable to count the pulses of the gated clock signal supplied from the clock control unit;
- a division number setting register that is one of the three registers and holds therein the value A as a setting value by which the gated clock signal is to be divided; and
- an output subunit operable to output the output clock signal by inverting a value of the output clock signal when a count value of the gated clock counter matches a value that is half the setting value set in the division number setting register,
each of the predetermined timings is when the count value of the division clock counter is less than the first setting value.

8. The semiconductor integrated circuit of claim 7, wherein the gated clock counter resets the count value thereof when the counter value matches the setting value set in the division number setting register.

9. A communication system for generating an output clock signal for a communication circuit by dividing a frequency of an input clock signal, the communication system comprising:
the communication circuit;
the semiconductor integrated circuit of claim 2;
a clock oscillator operable to supply the input clock signal to the semiconductor integrated circuit, wherein
the semiconductor integrated circuit receives the supply of the input clock signal, divides the frequency of the input clock signal to generate the output clock signal such that a cycle of the input clock signal approximates a cycle of a necessary clock signal for the communication circuit, and supplies the output clock signal to the communication circuit, and
the communication circuit performs communication based on the output clock signal supplied by the semiconductor integrated circuit.

10. The communication system of claim 9, wherein:
the communication circuit notifies the semiconductor integrated circuit of the cycle of the necessary clock signal, and the semiconductor integrated circuit outputs the output clock signal by determining the values A, B, and C, based on the cycle of the necessary clock signal that has been notified.

11. A communication system for generating an output clock signal for a communication circuit by dividing a frequency of an input clock signal, the communication system comprising:
the communication circuit;
the semiconductor integrated circuit of claim 4;
a clock oscillator operable to supply the input clock signal to the semiconductor integrated circuit, wherein
the semiconductor integrated circuit receives the supply of the input clock signal, divides the frequency of the input clock signal to generate the output clock signal such that a cycle of the input clock signal approximates a cycle of a necessary clock signal for the communication circuit, and supplies the output clock signal to the communication circuit, and
the communication circuit performs communication based on the output clock signal supplied by the semiconductor integrated circuit.

12. The communication system of claim 11, wherein:
the communication circuit notifies the semiconductor integrated circuit of the cycle of the necessary clock signal, and
the semiconductor integrated circuit outputs the output clock signal by determining the values A, B, and C, based on the cycle of the necessary clock signal that has been notified.

13. The semiconductor integrated circuit of claim 1, wherein the clock control unit masks C input clock pulses during B cycles of a divided clock.

14. The semiconductor integrated circuit of claim 1, wherein at least one of the values A, B and C is set by an operator in a corresponding one of the three registers.

* * * * *